US006828632B2

(12) United States Patent
Bhattacharyya

(10) Patent No.: US 6,828,632 B2
(45) Date of Patent: Dec. 7, 2004

(54) STABLE PD-SOI DEVICES AND METHODS

(75) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/197,978

(22) Filed: Jul. 18, 2002

(65) Prior Publication Data

US 2004/0014304 A1 Jan. 22, 2004

(51) Int. Cl.[7] .......................................... H01L 31/0392

(52) U.S. Cl. ...................... 257/347; 257/288; 257/348; 257/349; 257/616

(58) Field of Search ................................ 257/347, 348, 257/349, 616, 288

(56) References Cited

U.S. PATENT DOCUMENTS

| | | | |
|---|---|---|---|
| 5,250,834 A | 10/1993 | Nowak | 257/350 |
| 5,420,055 A | * 5/1995 | Vu et al. | 438/162 |
| 5,578,865 A | 11/1996 | Vu et al. | 257/611 |
| 5,801,396 A | 9/1998 | Chan et al. | 257/65 |
| 5,821,559 A | 10/1998 | Yamazaki et al. | 257/57 |
| 5,825,066 A | 10/1998 | Buynoski | 257/345 |
| 5,858,843 A | 1/1999 | Doyle et al. | 438/299 |
| 5,863,823 A | 1/1999 | Burgener | 438/295 |
| 5,877,046 A | 3/1999 | Yu et al. | 438/151 |
| 5,973,363 A | 10/1999 | Staab et al. | 257/347 |
| 6,044,011 A | 3/2000 | Marr et al. | 365/154 |
| 6,046,477 A | 4/2000 | Noble | 257/347 |
| 6,090,648 A | 7/2000 | Reedy et al. | 438/155 |
| 6,100,554 A | 8/2000 | Ishikawa et al. | 257/275 |
| 6,174,755 B1 | 1/2001 | Manning | 438/151 |
| 6,184,097 B1 | 2/2001 | Yu | 438/299 |
| 6,190,950 B1 | 2/2001 | Noble | 438/149 |
| 6,210,998 B1 | 4/2001 | Son | 438/162 |
| 6,215,145 B1 | 4/2001 | Noble | 257/315 |
| 6,225,176 B1 | 5/2001 | Yu | 438/305 |
| 6,225,667 B1 | 5/2001 | Buynoski et al. | 257/347 |
| 6,281,056 B2 | 8/2001 | Manning | 438/151 |
| 6,284,672 B1 | 9/2001 | Yu | 438/745 |

(List continued on next page.)

FOREIGN PATENT DOCUMENTS

GB  2233822  1/1991  ........... H01L/29/78

OTHER PUBLICATIONS

Bae, G.J., et al.,"A Novel SiGe–Inserted SOI Structure for High Performance PDSOI CMOSFETs", *2000 International Electron Devices Meeting. Technical Digest IEEE*, (2000), 667–670.

Bhattacharyya, Arup.,"Field–Shielded SOI–MOS Structure Free From Floating Body Effect, and Method of Fabrication Therfor", *Micron Application Reference No. 01–0740*, 37 pgs.

(List continued on next page.)

*Primary Examiner*—Richard Elms
*Assistant Examiner*—Douglas Menz
(74) *Attorney, Agent, or Firm*—Schwegman, Lundberg, Woessner & Kluth, P.A.

(57) ABSTRACT

One aspect of the present subject matter relates to a partially depleted silicon-on-insulator structure. The structure includes a well region formed above an oxide insulation layer. In various embodiments, the well region is a multi-layer epitaxy that includes a silicon germanium (Si—Ge) layer. In various embodiments, the well region includes a number of recombination centers between the Si—Ge layer and the insulation layer. A source region, a drain region, a gate oxide layer, and a gate are formed. In various embodiments, the Si—Ge layer includes a number of recombination centers in the source/drain regions. In various embodiments, a metal silicide layer and a lateral metal Schottky layer are formed above the well region to contact the source region and the well region. Other aspects are provided herein.

52 Claims, 12 Drawing Sheets

U.S. PATENT DOCUMENTS

| | | | |
|---|---|---|---|
| 6,288,425 B1 | 9/2001 | Adan | 257/347 |
| 6,297,115 B1 | 10/2001 | Yu | 438/305 |
| 6,337,500 B1 * | 1/2002 | Nakaoka et al. | 257/349 |
| 6,365,472 B1 | 4/2002 | Ishimaru et al. | 438/301 |
| 6,372,591 B1 | 4/2002 | Mineji et al. | 438/305 |
| 6,437,375 B1 | 8/2002 | Beaman | 257/192 |
| 6,479,866 B1 * | 11/2002 | Xiang | 257/347 |
| 6,531,743 B1 * | 3/2003 | Hirashita et al. | 257/354 |
| 6,537,891 B1 | 3/2003 | Dennison et al. | 438/406 |
| 6,541,822 B2 * | 4/2003 | Bae et al. | 257/347 |
| 6,548,361 B1 * | 4/2003 | En et al. | 438/301 |
| 6,593,192 B2 | 7/2003 | Zahurak et al. | 438/283 |
| 6,633,066 B1 * | 10/2003 | Bae et al. | 257/347 |
| 6,633,067 B2 | 10/2003 | Noble | 257/349 |
| 6,635,928 B2 | 10/2003 | Mouli | 257/347 |
| 6,716,682 B1 | 4/2004 | Mouli | 438/149 |
| 6,746,937 B2 | 6/2004 | Beaman | 438/455 |
| 2004/0041206 A1 | 3/2004 | Bhattacharyya | 257/326 |
| 2004/0041208 A1 | 3/2004 | Bhattacharyya | 257/347 |
| 2004/0041265 A1 | 3/2004 | Gonzalez et al. | 257/758 |
| 2004/0051140 A1 | 3/2004 | Bhattacharyya | 257/347 |
| 2004/0065927 A1 | 4/2004 | Bhattacharyya | 257/369 |
| 2004/0077151 A1 | 4/2004 | Bhattacharyya | 438/400 |

OTHER PUBLICATIONS

Chang, D., et al.,"Efficacy of Ar in Reducing the Kink Effect on Floating–Body NFD/SOI CMOS", *1998 IEEE International SOI Conference Proceedings*, (1998),155–156.

Gautier, Jacques, et al.,"SOI Floating–Body, Device and Circuit Issues", *1997 International Electron Devices Meeting. Technical Digest IEEE*, (1997),407–410.

Horiuchi, Masatada, et al.,"BESS: A Source Structure that Fully Suppresses the Floating Body Effects in SOI CMOS-FETs", *1996 International Electron Devices Meeting. Technical Digest IEEE*, (1996),121–124.

Hu, Chenming.,"SOI and Device Scaling", *1998 IEEE International SOI Conference Proceedings*, (1998),1–4.

Huang, L.J., et al.,"Carrier Mobility Enhancement in Strained Si–On–Insulator Fabricated by Wafer Bonding", *2001 Symposium on VLSI Technology. Digest Of Technical Papers*, Japan Society of Applied Physics, Tokyo, Japan, (2001),57–58.

Iwamatsu, Toshiaki, et al.,"CAD–Compatible High–Speed CMOS/SIMOX Gate Array Using Field–Shield Isolation", *IEEE Transactions on Electron Devices, 42, 11*, (Nov. 1995),1934–1939.

Kang, Hee S., et al., "Highly Stable SOI Technology to Suppress Floating Body Effect for High Performance CMOS Device", *2001 International Electron Devices Meeting. Technical Digest IEEE*, (2001),11.2.1–11.2.4.

Kumar, M.J. ,et al.,"Lateral Schottky Rectifiers for Power Integrated Circuits", *International Workshop on the Physics of Semiconductor Devices, 11th, 4746*, Allied Publishers Ltd., New Delhi, India,(2000),414–421.

Lee, V.V., et al.,"A Selective CVD Tungsten Local Interconnect Technology", *International Electron Devices Meeting. Technical Digest IEEE*, (1988),450–453.

Leobandung, E., et al., "Scalability of SOI Technology into 0.13 micrometer 1.2 V CMOS Generation", *International Electron Devices Meeting. Technical Digest IEEE*, (1998), 403–406.

Maeda, S., et al., "Suppression of Delay Time Instability on Frequency using Field Shield Isolation Technology for Deep Sub–Micron SOI Circuits", *1996 International Electron Devices Meeting. Technical Digest IEEE*, (1996),129–132.

Markoff, John.,"I.B.M. Circuits Are Now Faster and Reduce Use of Power", *The New York Time, Business Section*, (Feb. 25, 2002),2 pgs.

Rim, K.,et al. ,"Strained Si NMOSFETs for High Performance CMOS Technology", *2001 Symposium on VLSI Technology. Digest of Technical Papers*, Japan Society of Applied Physics, Tokoy, Japan,(2001),59–60.

Saggio, M., et al. ,"Innovative Localized Lifetime Control in High–Speed IGBT's", *IEEE Electron Device Letters, 18, 7*, (1997),333–335.

Shino, T., et al. ,"Ar Implantation Effects in SOI NMOS-FET's under Low Voltage Operation", *2001 IEEE International SOI Conference Proceedings*, (2001),89–90.

Sleight, Jeffrey, et al.,"A Compact Schottky Body Contact Technology for SOI Transistors", *International Electron Devices Meeting. Technical Digest IEEE*, (1997),419–422.

Sze, S.M., *Physics of Semiconductor Devices, 2nd Edition*, John Wiley & Sons, Inc., New York,(1981),21.

Van Meer, Hans, et al. ,"Ultra–Thin Film Fully–Depleted SOI CMOS with Raised G/S/D Device Architecture for Sub–100 nm Applications", *2000 IEEE International SOI Conference*, (2001),45–46.

Xu, X., et al. ,"Impact of Channel Doping and Ar Implant on Device Characteristics of Partially Depleted SOI MOS-FETs", *1998 IEEE International SOI Conference Proceedings*, (1998),115–116.

Mistry, K R., et al., "Parasitic bipolar gain reduction and the optimization of 0.25– mu m partially depleted SOI MOS-FETs", *IEEE Transactions on Electron Devices, 46(11)*, (Nov. 1999),2201–9.

Nishisaka, M , et al., "Reduction of the floating body effect in SOI MOSFETs by using Schottky source/drain contacts", *Japanese Journal of Applied Physics, Part 1 (Regular Papers, Short Notes & Review Papers), 37(3B)*, (Mar. 1998),1295–9.

Yoshimi, M , et al., "Technology trends of silicon–on–insulator–its advantages and problems to be solved", *IEEE International Electron Devices Meeting 1994. Technical Digest*, (1994),429–32.

* cited by examiner

STABLE PD-SOI DEVICES AND METHODS

CROSS-REFERENCE TO RELATED APPLICATIONS

This application is related to the following commonly assigned U.S. patent application which is herein incorporated by reference in its entirety: "Field-Shielded SOI-MOS Structure Free From Floating Body Effects, and Method of Fabrication Therefore," Ser. No. 09/984,778. Publication No. 20040077151A1, filed on Oct. 31, 2001.

TECHNICAL FIELD

This disclosure relates generally to integrated circuits, and more particularly, to partially depleted silicon-on-insulator systems, methods and devices.

BACKGROUND

PD (partially depleted)-SOI (silicon-on-insulator)-CMOS (complementary metal oxide semiconductor) technology has significant speed, power and radiation immunity advantages over bulk CMOS technology. However, it has been difficult to manage the floating body effect (FBE) of SOI devices. One problem associated with PD-SOI-CMOS devices involves an unstable body potential over a range of frequencies. Thus, PD-SOI-CMOS technology has yet to be widely accepted by the systems and design communities.

In bulk NMOSFET devices, for example, the body often is tied to a fixed potential or to the source of the device However, the body potential in NMOSFET-SOI is floating and remains unstable due to the complex dynamics of hole generation at the drain edge, and with carrier recombination and diffusion. Several undesirable characteristics results from FBE, such as "Kink Effect" (current enhancement) in Id-Vg characteristics of the device, enhanced leakage due to parasitic (npn) bipolar (BJT) current, and enhanced 1/f noise. These effects restrict the ability to design complex circuits and the range of applications for SOI technology. Circuit-related issues attributable to FBE include threshold instability, hysteretic behavior in signal input/output, frequency-dependent pulse delays, and signal pulse width modulation.

In logic design, FBE can lead to data loss, dynamic circuit failure and timing delays. Additionally, FBE can limit analog circuit applications due to transistor mismatch and enhanced AC/DC noise.

One proposed solution for suppressing FBE involves Field Shield Isolation technology. Another proposed solution for suppressing FBE involves Bipolar Embedded Source Structure (BESS). Another proposed solution for suppressing FBE involves Si—Ge Inserted SOI. Another proposed solution for suppressing FBE involves SOI devices with implanted recombination centers. Another proposed solution involves Schottky body-contacted SOI.

These proposed solutions reduce parasitic effects by regulating body potential but do not provide frequency independent device threshold. Therefore, these proposed solutions are limited in scope since the floating body potential is time dependent and the body potential at any instant is the transient result of multiple mechanisms of widely differing time constants. If the body potential could be regulated such that it is time-independent (i.e. frequency independent), and could be accurately predicted, the body potential could be utilized to significantly enhance circuit performance and complex circuit design.

Additionally, in the current state-of-the-art associated with bulk silicon technology, complex circuit and system designs require the use of design simulators, tools, and methodology in which embedded device models accurately predict device thresholds within a wide range of operating frequencies at all design and application conditions (viz. geometry, doping profile, temperature, node potential etc). However, these simulators, tools and methodology are not available for SOI technology due to the time-dependent threshold of the floating body SOI device.

Therefore, there is a need in the art to provide improved PD-SOI-CMOS devices and fabrication methods that ensures frequency-independent device threshold by means of providing frequency independent body potential.

SUMMARY

The above mentioned problems are addressed by the present subject matter and will be understood by reading and studying the following specification. The present subject mater provides a PD-SOI-CMOS device and fabrication method that achieve a stable body potential over a wide frequency range spanning from the steady state to the fastest transient. Thus, the PD-SOI-CMOS devices are able to be used for enhanced device and circuit performance. The PD-SOI-CMOS device provides a stable device threshold independent of circuit switching frequency as long as the stable body potential value is appropriately lower than the built-in potential of the body-source (NFET) junction. The device is immune to parasitic FBE. Complex and wide range of static and dynamic circuits are capable of using such devices and standard design tools, including system on chip solutions and other complex chip designs.

One aspect of the present subject matter relates to a partially depleted silicon-on-insulator structure. According to various embodiments, the structure includes a substrate, an oxide insulation layer disposed above the silicon substrate, and a well region formed above the oxide insulation layer. In various embodiments, the well region includes a first silicon (Si) epitaxial layer disposed above the oxide insulation layer, a silicon germanium (Si—Ge) epitaxial layer disposed above the first Si epitaxial layer, and a second Si epitaxial layer disposed above the Si—Ge epitaxial layer. In various embodiments, the first Si epitaxial layer includes a number of recombination centers. These recombination centers are also referred to herein as BOX (buried oxide) recombination centers as they are in the proximity of the buried oxide region of the device. In various embodiments, the Si—Ge epitaxial layer includes a number of recombination centers. At least one source region and at least one drain region are formed in the well region. In various embodiments, the recombination centers in the Si—Ge epitaxial layer are positioned selectively in only the source region or both in the source and drain regions. A gate oxide layer is formed above the well region to define a channel region in the well region between the source region and the drain region. A gate is formed above the gate oxide layer. In various embodiments, a metal silicide layer is formed above the source-drain region as well as on top of the polysilicon gate, and a second lateral metal Schottky layer with appropriate work function is selectively formed above the source region and the substrate region.

The selectively formed lateral metal Schottky layer provides an integrated source-body Schottky diode whose forward characteristics uniquely targets the steady state potential for the body of the SOI device. In various embodiments, the steady state potential for the body of the SOI device is capable of being targeted in the range of 0.3 to 0.5 volts, depending on the material work function used for the lateral metal Schottky layer. The body does not get sufficiently charged up to trigger the bipolar action because the body has and maintains a low, stable potential that is lower than the source-substrate forward potential required for bipolar action.

The graded, epitaxially grown Si—Ge layer creates a lower body-source barrier potential and provides a preferential path for sweeping thermally-generated excess holes for recombination at the source-body region of the channel associated with that region. The localized recombination centers in the Si—Ge epitaxial layer enhance of the recombination of holes at the source-body region of the channel.

The BOX recombination centers readily recombine excess holes generated by impact ionization at the bottom part of the drain-body region. These excess holes are recombined at the body-BOX region. This recombination of excess holes has a very short time constant because of the proximity of the recombination centers.

Regardless of the time constant and mechanism of hole generation, the recombination time constant is significantly faster than the intrinsic switching time of the device, and therefore, the threshold of the device is maintained constant at all circuit frequencies. The resulting device does not exhibit any floating body parasitic effects or any enhanced DIBL (drain induced barrier lowering) effect as seen in standard SOI devices. Circuits do not exhibit hysteretic effects, regardless of pulse frequency. Additionally, circuits do not exhibit excessive pass-gate leakage induced data loss or pulse width modulation. The lower threshold for such device with nearly ideal turn-on provides enhanced performance without the FBE.

According to various embodiments of the present subject matter, the partially depleted silicon-on-insulator structure includes various combinations of the BOX recombination centers, the Si—Ge epitaxial layer, the Si—Ge epitaxial layer with recombination centers, the metal silicide layer, and the selective lateral metal Schottky layer. Thus, for example, various embodiments of the present subject matter provide a structure that includes an Si—Ge epitaxial layer with recombination centers. Various embodiments provide a structure that includes and Si—Ge epitaxial layer with a selective lateral metal Schottky layer. Various embodiments provide a structure that includes a Si—Ge epitaxial layer with recombination centers and a selective lateral metal Schottky layer. Various embodiments provide a structure that includes BOX recombination centers and a selective lateral metal Schottky layer. Various embodiments provide a structure that includes BOX recombination centers with a Si—Ge epitaxial layer. Various embodiments provide a structure that includes BOX recombination centers and a Si—Ge epitaxial layer with recombination centers.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. Other embodiments may be utilized and structural, logical, and electrical changes may be made without departing from the scope of the present subject matter. The following detailed description is, therefore, not to be taken in a limiting sense, and the scope of the present subject matter is defined only by the appended claims, along with the full scope of equivalents to which such claims are entitled.

The present subject matter provides a PD-SOI-CMOS device, and fabrication method therefor, that achieves a stable body potential over a wide frequency range spanning from the steady state to the fastest transient. Thus, the PD-SOI-CMOS devices are able to be used for enhanced device and circuit performance. The PD-SOI-CMOS device provides a stable device threshold independent of circuit switching frequency as long as the stable body potential value is appropriately lower than the built-in potential of the body-source (NFET) junction.

Figure 1:
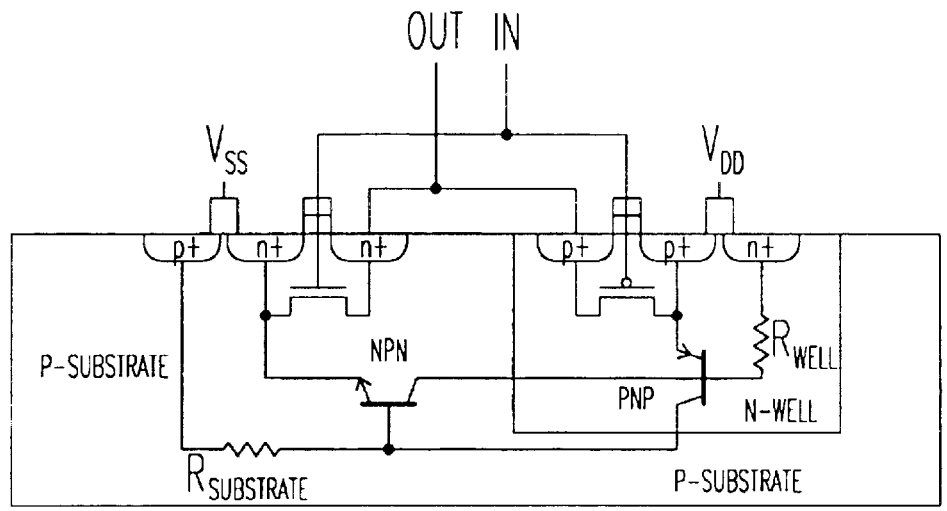
FIG. 1 is a cross section of a CMOS inverter on which is overlaid an equivalent circuit that illustrates one problem associated with floating body effect (FBE).

A bipolar effect for PD-SOI-CMOS devices is described below with respect to FIGS. 1–2. FIG. 1 is a cross section of a CMOS inverter on which is overlaid an equivalent circuit that illustrates one problem associated with floating body effect (FBE), and FIG. 2 illustrates an equivalent circuit for the CMOS inverter of FIG. 1.

Weste and Eshraghian (Principles of CMOS VLSI Design: A Systems Perspective, $2^{nd}$ Edition, Addison Wesley 1993) explain one problem associated with FBE using the cross section of a CMOS inverter, shown in FIG. 1, on which is overlaid an equivalent circuit. The equivalent circuit includes the NMOS and PMOS transistors of the inverter, and further includes an NPN transistor, a PNP transistor, and two resistors connected between the power and ground rails. The NPN and PNP transistors, along with the two resistors, are referred to as a parasitic circuit.

The pnp transistor has its emitter formed by the p+ source/drain implant used in the PMOS transistors, its base is formed by the n well, and its collectors is formed by the p-well. The npn transistor has its emitter formed by the n+ source/drain implant, its base is formed by the p-substrate, and its collector is formed by the n-well. The substrate resistance $R_{substrate}$ and well resistance $R_{well}$ are caused by the resistivity of the semiconductors involved.

Figure 2:
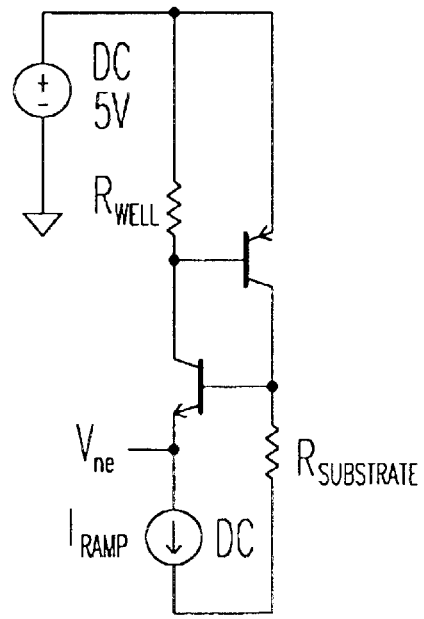
FIG. 2 illustrates an equivalent circuit for the CMOS inverter of FIG. 1.

As illustrated in the circuit of FIG. 2, if a current is drawn from the npn-emitter, the emitter voltage becomes negative with respect to the base until the base emitter voltage is approximately 0.7 volts. It is noted that this potential also can be formed at various frequencies by the complex dynamics of hole generation at the drain edge, and the complex dynamic associated with recombination and diffusion.

At this point, the npn-transistor turns on and a parasitic leakage current flows from the collector (drain) to the emitter (source) due to the common emitter current amplification of the npn-transistor. This raises the base-to-emitter voltage of the pnp-transistor and can raise to a point which may turn on the lateral pnp-transistor. This in turn raises the npn base voltage causing a positive feedback condition. At a certain npn-base-emitter voltage, the emitter voltage suddenly snaps back and enters a stable state called the ON state. This state persists as long as the voltage across the two transistors is greater than the holding voltage. The current drawn is often destructive, causing data loss for the inverter logic.

It is noted that the present subject matter is illustrated in terms of the NFET-SOI devices in various portions of this specification. NFET-SOI devices are responsible primarily for the parasitic FBE due to the creation of excess holes in the p-type body by impact ionization. Thus, it is desirable to provide a fast time constant for these excess holes. Although electrons have an intrinsically higher mobility than holes, the present subject matter also has application for PFET-SOI devices.

The present subject matter uses various combinations of BOX recombination centers, an Si—Ge epitaxial layer, an Si—Ge epitaxial layer with recombination centers, the metal silicide layer, and a lateral metal Schottky layer to achieve a stable body potential over a wide frequency range.

BOX recombination centers suppress FBE and improve DIBL (drain induced barrier lowering). In an NFET-SOI device, the BOX recombination centers create a recombination region for holes and neutralizes free carriers by recombination. The structure is created below the n+ source region between the SOI/BOX (buried oxide) interface.

A graded thin layer of Si—Ge is epitaxially inserted toward the bottom of a silicon body to create a narrow band gap region (the band gap of Ge is 0.66 eV compared to a band gap of 1.12 eV for Si) in the body. In a p-type silicon body, the Si—Ge layer lowers the body-source potential barrier to hole current without affecting the FET channel characteristics. This creates a preferred shunt path for free carriers (holes) and promotes enhanced recombination at the n+Si—Ge (source-element)/p– Si—Ge (body element) region. This in turn reduces the body potential and turns off any possible parasitic bipolar action.

In various embodiments, the recombination centers include low energy helium implants which create localized yet stable voids that introduce midgap states. The incorporation of helium implanted void-induced recombination centers is capable of providing orders of magnitude reduction in carrier lifetime, and thereby recombination time constant.

Schottky body-contacted SOI provides a lateral source-body Schottky diode into the SOI device. Schottky body-contacted SOI is effective for both NFET and PFET devices with minimum area impact. The Schottky has the advantage to be the majority carrier device and the forward turn-on characteristics can be significantly modulated and enhanced by appropriately selecting the metal to silicon work function (the Schottky barrier height).

Figure 3:
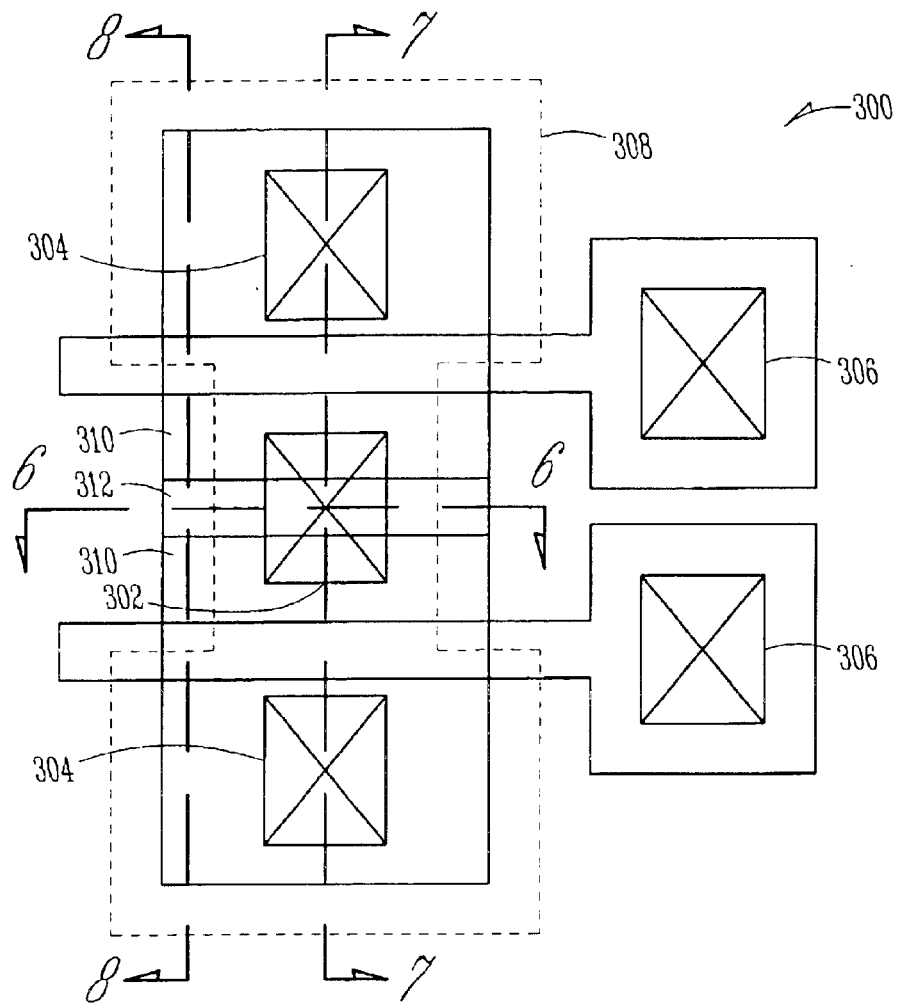
FIG. 3 illustrates two NFET-type SOI devices with a common source according to various embodiments of the present subject matter.

FIG. 3 illustrates two NFET-type SOI devices with a common source according to various embodiments of the present subject matter. The illustrated structure 300 includes a source contact 302 for a common source region, two drain contacts 304 for two drain regions, and two gate contacts 306. A special mask 308 defines the body-potential controlling Schottky. A silicided lateral Schottky 310 is deposited, and a metal lateral Scottky layer 312 is selectively deposited in such region to control the barrier height and thereby the forward characteristics of the body-potential controlling Schottky. No special contact mask is needed for the p-region of the lateral Schottky. The source contact 302 overlaps both the metal 312 and the silicide regions 310 of the source diffusion. Thus, the metal and silicide regions 312, 310 provide parallel contact between the source region and the body.

Figure 4:
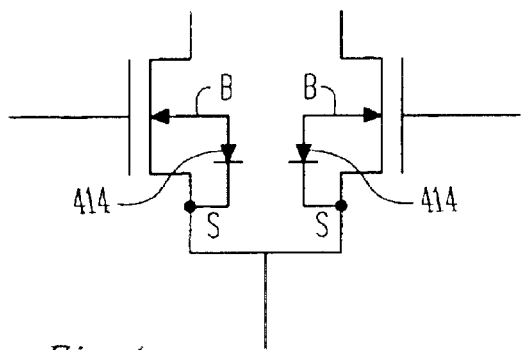
FIG. 4 illustrates a schematic of NFET-type SOI devices with a common source as provided FIG. 3.

FIG. 4 illustrates a schematic of NFET-SOI devices with a common source as provided FIG. 3. Schottky diodes 414 are illustrated between the body (B) and source (S) of the NFET-SOI device. In various embodiments, the Schottky diodes 414 are provided by a silicided lateral Schottky layer. In various embodiments, the Schottky diodes 414 are provided by a metal lateral Schottky layer. In various embodiments, the Schottky diodes are provided by a parallel contact between the body and the source formed by a silicided lateral Schottky layer and a metal lateral Schottky layer.

Figure 5:
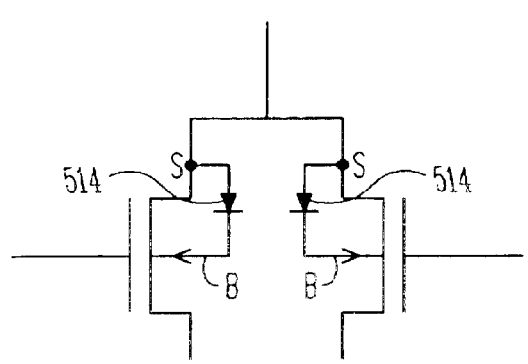
FIG. 5 illustrates a schematic of PFET-type SOI devices with a common source as provided in FIG. 3.

FIG. 5 illustrates a schematic of PFET-SOI devices with a common source as provided in FIG. 3. Schottky diodes are illustrated between the body (B) and source (S) of the PFET-SOI device. In various embodiments, the Schottky diodes 514 are provided by a silicided lateral Schottky layer. In various embodiments, the Schottky diode 514 are provided by a metal lateral Schottky layer. In various embodiments, the Schottky diodes 514 are provided by a parallel contact between the body and the source formed by a silicided lateral Schottky layer and a metal lateral Schottky layer.

Figure 6:
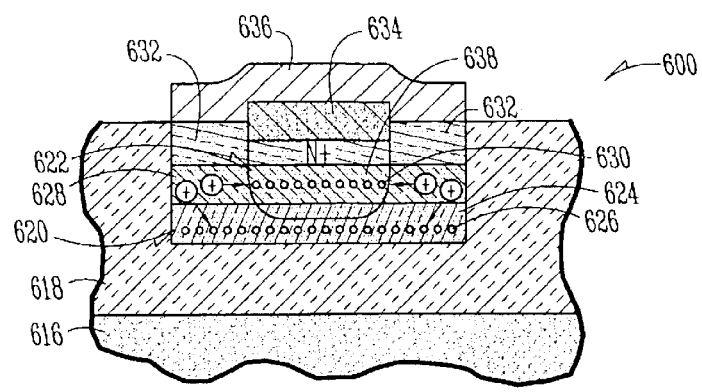
FIG. 6 illustrates a cross section along line 6—6 in FIG. 3 according to various embodiments of the present subject matter.

FIG. 6 illustrates a cross section along line 6—6 in FIG. 3 according to various embodiments of the present subject matter. The illustrated structure 600 represents the common source region of FIG. 3.

The illustrated structure 600 includes a substrate 616, a buried oxide insulation layer 618 disposed above the substrate, and a p-type active epitaxial silicon region 620 formed above the buried oxide insulation layer. The active region has a first silicon p-epitaxial layer 624 and a n+ source/drain region 622 (a common source region 622 is illustrated). The active region 620 includes a first silicon (Si) p-type epitaxial layer 624 disposed above the oxide insulation layer 618. The illustrated first Si p-type epitaxial layer 624 includes a number of recombination centers 626. A silicon germanium (Si—Ge) p-type epitaxial layer 628 is disposed above the first Si p-type epitaxial layer. This layer also has a n+ source/drain region 638. The illustrated Si—Ge epitaxial layer 638 includes a number of recombination centers 630 in the overall n+ source region 622. A Si top p-type epitaxial layer 632 is disposed above the Si—Ge epitaxial layer 628. Layer 632 forms the active channel region of a FET.

The source region 622 is formed in the p-type region 620. The illustrated structure shows that the recombination centers 630 in the Si—Ge layer 638 are formed in the source region 622. In various embodiments, the recombination centers are formed when the source region is formed.

A gate oxide layer and an overlayer of polysilicon gate are formed above the top silicon p-type epitaxial layer to define the channel region of the NFET. The polysilicon gate is heavily doped with n-type impurities. A metal silicide layer 634 is formed on top of the n+ polysilicon gate as well as over the source (drain) region 622. A lateral metal Schottky layer 636 is selectively formed above the top p-type epitaxial layer 632 and overlaps the metal silicide layer 634. The metal silicide layer 634 and the metal Schottky layer 636 both serve to form lateral p-n+ diodes, as well as metal-p/silicide-p Schottky diodes. In various embodiments, the metal-p Schottky diodes serve to clamp the body (p-type) potential to a stable desired value.

In various embodiments, the first Si substrate layer 624 has a p-conductivity and has a thickness within a range of 10–30 nm thick. In various embodiments, the p-substrate layer includes a layer of helium-implanted nano-cavities 626 to provide enhanced recombination centers. In the illustrated structure, this layer of recombination centers 626 is present in the entire channel region near the interface of the BOX and the first Si epitaxial layer, and is produced near the beginning of the process. These recombination centers 626 (also referred to herein as BOX recombination centers) are primarily responsible for providing a fast time constant for excess charge carriers created during impact ionization.

In various embodiments, a layer of helium-implanted nanocavities 630 is present in the n+ region 638 of the Si—Ge layer 628. The nano-cavities are defined selectively by the source/drain diffusion mask to control the recombination life time of the thermally generated charge carriers. In various embodiments, this layer is processed at the time of source/drain implants, and uses the activation anneal for defining the nano-cavities and associated recombination centers. Due to the lower body to source barrier potential in the Si—Ge layer, thermally generated carriers are preferentially channeled into the Si—Ge layer and are readily recombined into the recombination centers in the Si—Ge layer in the n+ source.

The desired body potential is capable of being tailored and limited in the range of 0.2 to 0.5 V (thus preventing the body from charging up higher to trigger parasitic bipolar action of the body-source p-n junction) by selecting an appropriate material for the metal lateral Schottky layer 636. In various embodiments, the metal lateral Schottky layer includes tungsten (W), nickel (Ni), titanium (Ti), gold (Au), cobalt (Go) and magnesium (Mg). With respect to an NEET-SOT device that has a p-Si body, a W-Schottky provides a barrier height of 0.45 V, a Ni-Schottky provides a barrier height of 0.51 V, a Ti-Schottky provides a barrier height of 0.61 V, and a Au-Schottky provides a barrier height of 0.34 V. Since the metal Schottky junction is a majority carrier device with a sharp forward turn-on characteristic and no minority carrier is injected, the body maintains a stable potential clamped by the Schottky. With respect to a PFET-SOI device that has an n-Si body, a W-Schottky provides a barrier height of 0.67 V. a Ti-Schottky provides a barrier height of 0.5 V, and a Mg-Schottky provides a barrier height of 0.4 V. According to various embodiments, the metal lateral Schottky layer is selectively deposited by e-beam evaporation, by sputtering, by selective chemical vapor deposition (CVD) deposition technique (such as for tungsten), or by atomic layer deposition (ALD).

Figure 7:
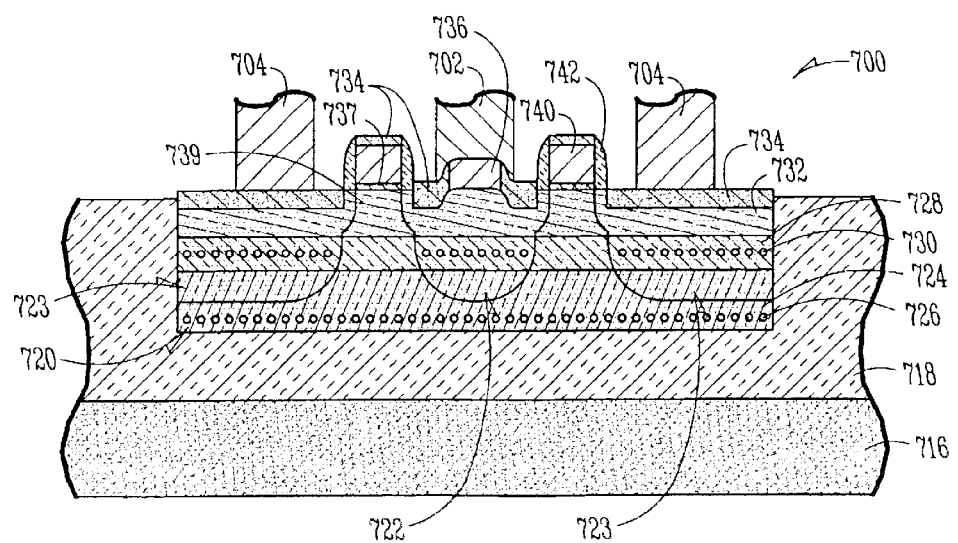
FIG. 7 illustrates a cross section along line 7—7 in FIG. 3 according to various embodiments of the present subject matter.

FIG. 7 illustrates a cross section along line 7—7 in FIG. 3 according to various embodiments of the present subject matter. The figure illustrates the common source region and the two drain regions of FIG. 3.

The illustrated structure 700 includes a substrate 716, an oxide insulation layer 718 disposed above the substrate 716, and an active region 720 formed above the oxide insulation layer 718. A first silicon (Si) epitaxial layer 724 is disposed above the oxide insulation layer 718. The illustrated first Si epitaxial layer 724 includes a number of recombination centers 726. A silicon germanium (Si—Ge) epitaxial layer 728 is disposed above the first Si epitaxial layer 724. The illustrated Si—Ge epitaxial layer 728 includes a number of recombination centers 730. A top Si epitaxial layer 732 disposed above the Si—Ge epitaxial layer 728.

The source region 722 and drain regions 723 are formed in the active region 720. The illustrated structure 700 shows that the recombination centers 730 are formed in the source region 722 and drain regions 723. In various embodiments, the recombination centers 730 are formed when the source and drain regions 722, 723 are formed.

A gate oxide layer 737 is formed above the active region to define a channel region 739 in the active region between the source region 722 and the drain region 723. A gate 740 (with spacers 742) formed above the gate oxide layer. A metal silicide layer 734 is formed on the source/drain region of the top Si epitaxial layer 732, and a lateral metal Schottky layer selectively formed above the top Si epitaxial layer. The metal silicide layer 734 and the lateral metal Schottky layer 736 contact the source region 722 and the top silicon epitaxial layer 732, and function to provide a stable low potential to the body 720 of the active devices. The figure illustrates source contacts 702 and drain contacts 704, as previously shown at 302 and 304 in FIG. 3.

Figure 8:
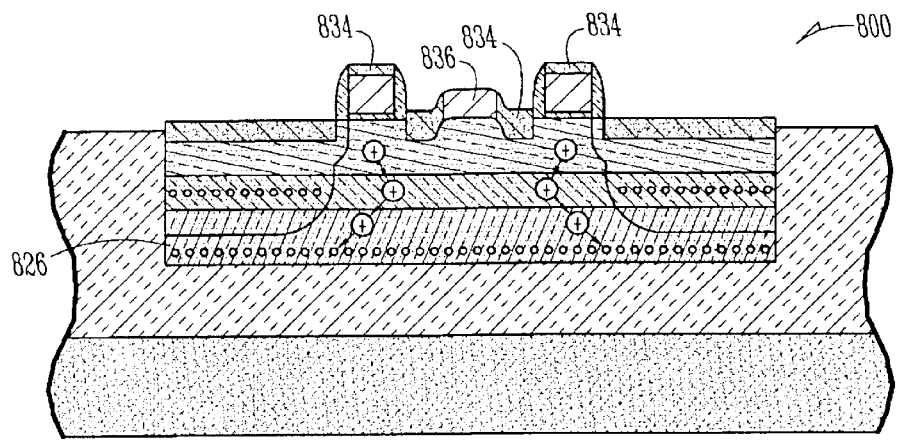
FIG. 8 illustrates a cross section along line 8—8 in FIG. 3 according to various embodiments of the present subject matter.

FIG. 8 illustrates a cross section along line 8—8 in FIG. 3 according to various embodiments of the present subject matter. The illustrated structure 800 shows the metal silicide layer 834 and the lateral metal Schottky layer 836 form two parallel diodes between the source region and body region. The diodes thus formed function to provide a stable low potential to the body of active devices. FIG. 8 also illustrates the recombination of holes using the BOX recombination centers 826.

In various embodiments, the lateral metal Schottky layer 836 includes tungsten (W). The silicided lateral Schottky has a higher barrier height (e.g. 0.65 to 0.75 V) than the W-Schottky (0.45 V barrier height with respect to p-Si). According to various embodiments, the silicided lateral Schottky includes Tungsten Silicide ($WSi_2$), Cobalt Silicide (CoSi) or Nickel Silicide (NiSi).

Figure 9:
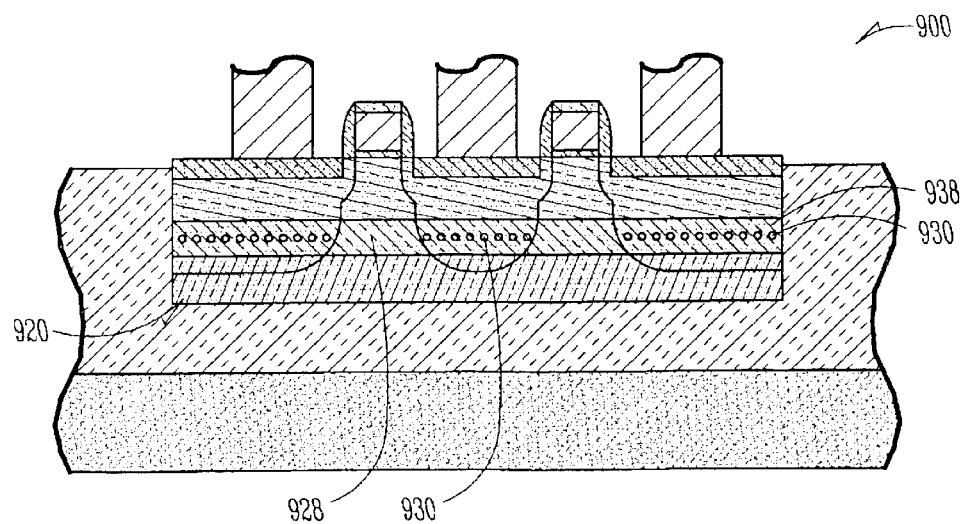
FIG. 9 illustrates a cross section, such as that illustrated in FIG. 7, according to various embodiments of the present subject matter.

FIG. 9 illustrates a cross section, such as that illustrated in FIG. 7, according to various embodiments of the present subject matter. The illustrated structure 900 includes a Si—Ge epitaxial layer 928 and n+ part of the same layer 938 in the body 920. Recombination centers 930 are formed in the Si—Ge epitaxial layer 938 with the source/drain regions. The function of the SiGe layer and the recombination centers was described above, and will not be repeated here.

Figure 10:
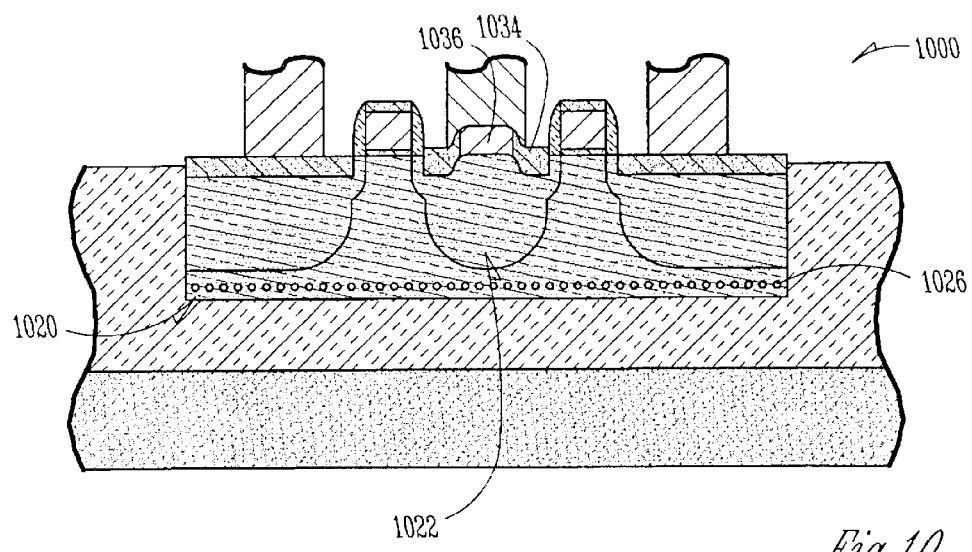
FIG. 10 illustrates a cross section, such as that illustrated in FIG. 7, according to various embodiments of the present subject matter.

FIG. 10 illustrates a cross section, such as that illustrated in FIG. 7, according to various embodiments of the present subject matter. The illustrated structure 1000 includes recombination centers 1026 (BOX recombination centers) formed in the well below the source/drain regions. A metal silicide layer 1034 and a metal lateral Schottky layer 1036 provide parallel diode contacts between the body 1020 and the source region 1022. The function of the BOX recombination centers, the metal silicide layer, and the metal lateral Schottky layer was described above, and will not be repeated here.

Figure 11:
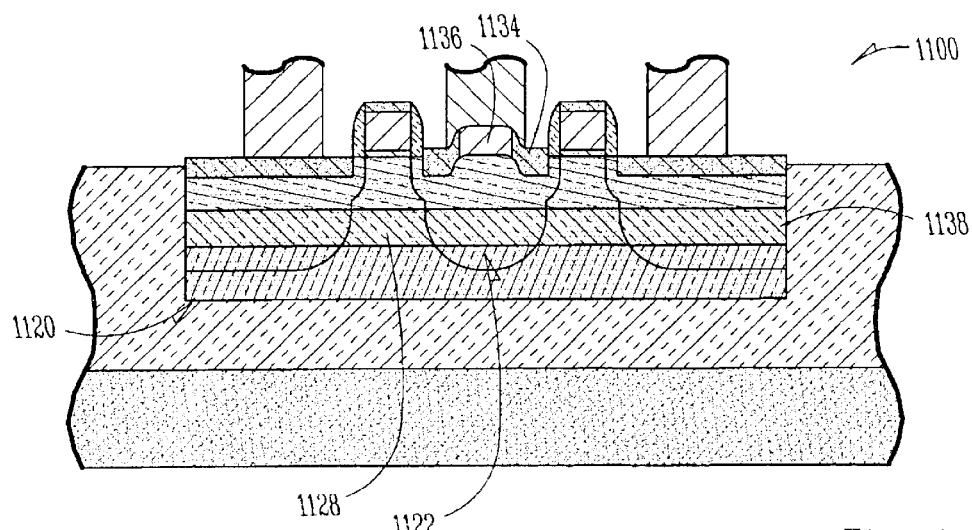
FIG. 11 illustrates a cross section, such as that illustrated in FIG. 7, according to various embodiments of the present subject matter.

FIG. 11 illustrates a cross section, such as that illustrated in FIG. 7, according to various embodiments of the present subject matter. The illustrated structure 1100 includes a Si—Ge epitaxial layer 1128 and the n+ part of the same layer 1138 in the body 1120. A metal silicide layer 1134 and a metal lateral Schottky layer 1136 provide parallel diode contacts between the body 1120 and the source region 1122. The function of the Si—Ge epitaxial layer, the metal silicide layer, and the metal lateral Schottky layer was described above, and will not be repeated here.

Figure 12:
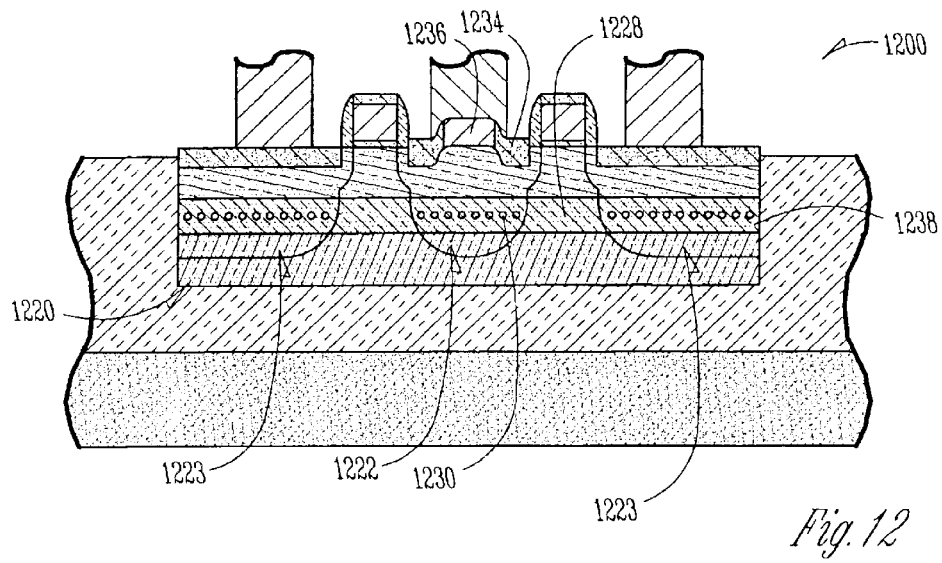
FIG. 12 illustrates a cross section, such as that illustrated in FIG. 7, according to various embodiments of the present subject matter.

FIG. 12 illustrates a cross section, such as that illustrated in FIG. 7, according to various embodiments of the present subject matter. The illustrated structure 1200 includes a Si—Ge epitaxial layer 1228 with the associated n+ diffused region 1238. Recombination centers 1230 are formed in the Si—Ge epitaxial layer 1238 with the source/drain regions 1222, 1223. A metal silicide layer 1234 and a metal lateral Schottky layer 1236 provide parallel diode contacts between the body (well) 1220 and the source region 1222. The function of the Si—Ge epitaxial layer, the recombination centers, the metal suicide layer, and the metal lateral Schottky layer was described above, and will not be repeated here.

Figure 13:
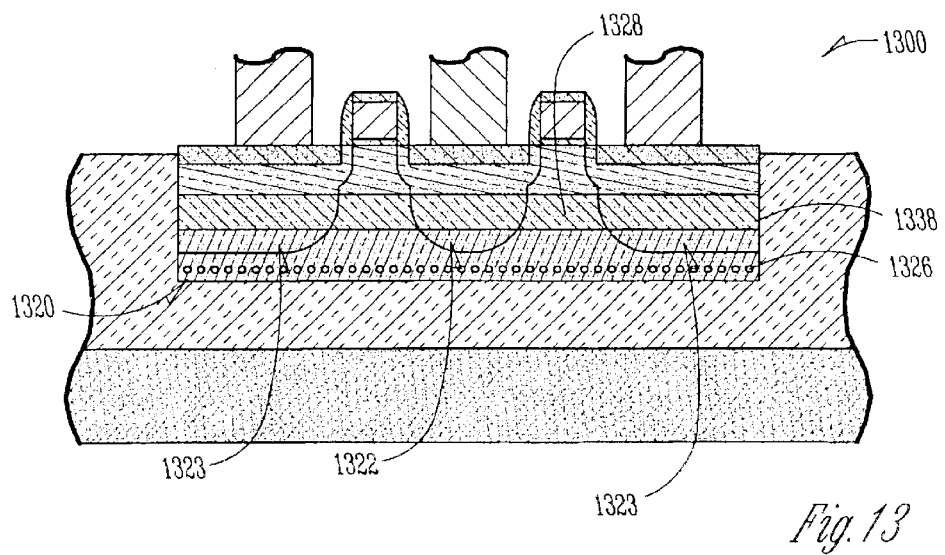
FIG. 13 illustrates a cross section, such as that illustrated in FIG. 7, according to various embodiments of the present subject matter.

FIG. 13 illustrates a cross section, such as that illustrated in FIG. 7, according to various embodiments of the present subject matter. The illustrated structure 1300 includes a Si—Ge epitaxial layer 1328 in the body 1320. The illustrated structure includes recombination centers 1326 (BOX recombination centers) formed in the well below the source/drain regions 1322, 1323. The function of the Si—Ge epitaxial layer and the BOX recombination centers was described above, and will not be repeated here.

Figure 14:
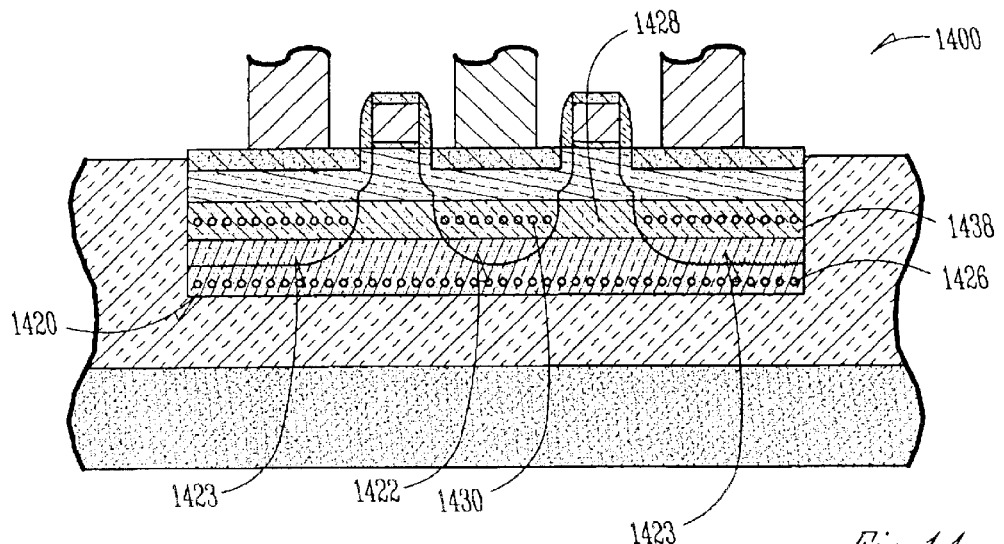
FIG. 14 illustrates a cross section, such as that illustrated in FIG. 7, according to various embodiments of the present subject matter.

FIG. 14 illustrates a cross section, such as that illustrated in FIG. 7, according to various embodiments of the present subject matter. The illustrated structure 1420 includes a Si—Ge epitaxial layer 1428 and associated n+ diffused region 1438 in the body 1420. Recombination centers 1430 are formed in the Si—Ge epitaxial layer 1438 with the source/drain regions 1422, 1423. The illustrated structure includes recombination centers 1426 (BOX recombination centers) formed in the well below the source/drain regions. The function of the Si—Ge epitaxial layer, the recombination centers contained therein, and the BOX recombination centers was described above, and will not be repeated here.

Figure 15:
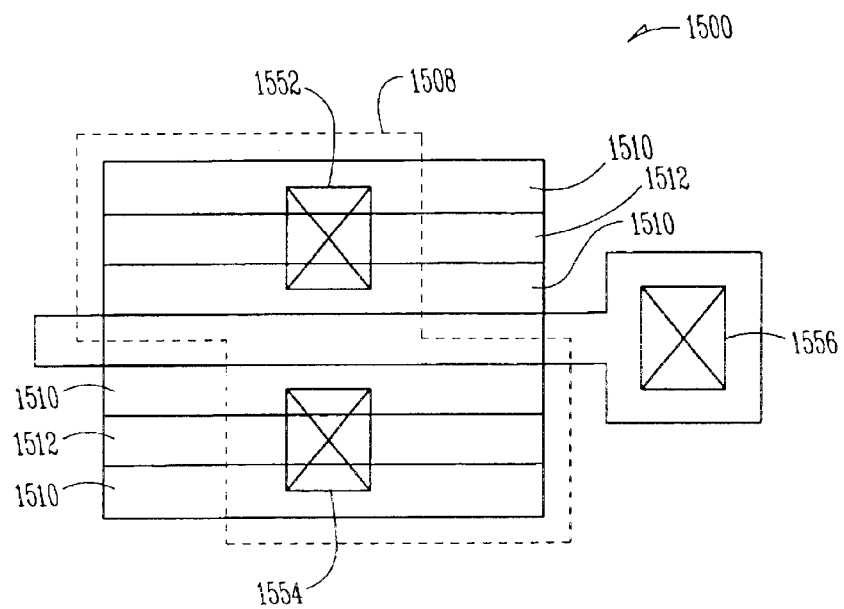
FIG. 15 illustrates a symmetric NFET-SOI device according to various embodiments of the present subject matter.

FIG. 15 illustrates a symmetric NFET-SOI device according to various embodiments of the present subject matter. A first source/drain region 1552, a second source/drain region 1554, and a gate region 1556 are shown. A symmetrical mask 1508 is illustrated. Metal lateral Schottky devices 1510, 1512 are present on both interchangeable source/drain regions 1554 of the device. Thus, a somewhat larger area of the active region is required.

Figure 16:
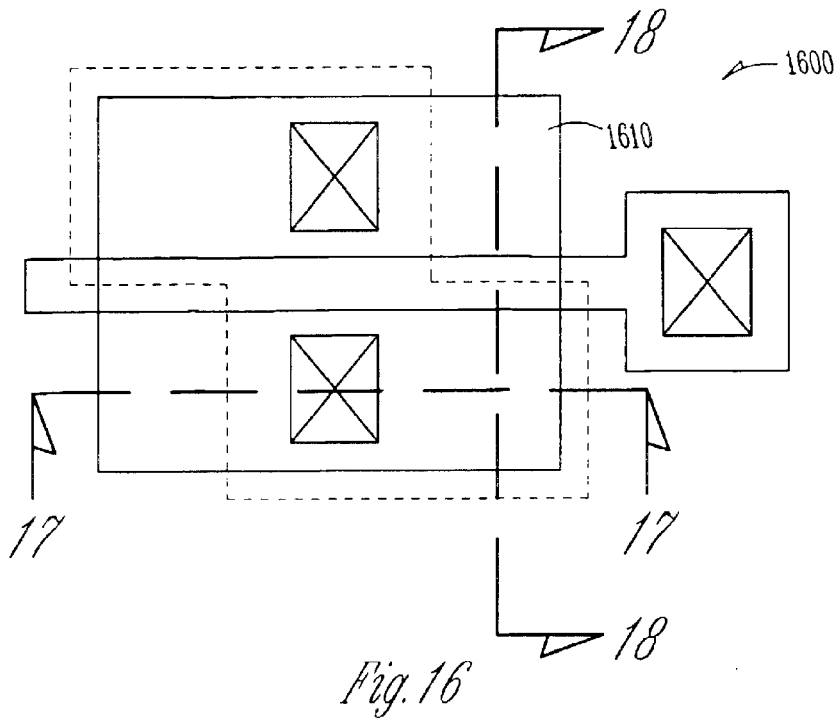
FIG. 16 illustrates a symmetric PFET-SOI device according to various embodiments of the present subject matter.

FIG. 16 illustrates a symmetric PFET-SOI device according to various embodiments of the present subject matter. The PFET device is formed in a lightly doped n-well body. The source-drain diffusions are formed by heavily doping the body. With respect to a PFET-SOI, a combination of as formed silicided lateral Schottky (with a barrier height of 0.65 to 0.75 V), lower n-well-source (p+) barrier potential and recombinations centers in both Si—Ge layer and at the box-well interface are sufficient to maintain stable n− well potential and short recombination time constant due to the higher intrinsic mobility of electrons. Therefore, an additional low barrier height metal lateral Schottky is not required for PFET. The silicide lateral Schottky 1610 is shown in the illustrated structure 1600. Other embodiments include an appropriate metal lateral Schottky layer, if required.

Figure 17:
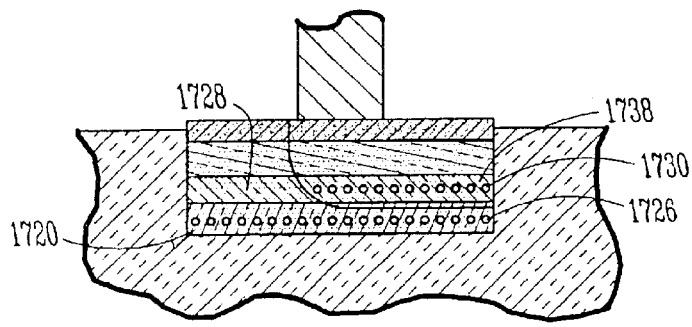
FIG. 17 illustrates a cross section along line 17—17 of FIG. 16 according to various embodiments of the present subject matter.

FIG. 17 illustrates a cross section along line 17—17 of FIG. 16 according to various embodiments of the present subject matter. An n-well 1720 is shown. BOX recombination centers 1726 are illustrated at the BOX-well interface (below the source/drain regions). A Si—Ge layer 1728 and associated p+ region 1738 in source/drain regions have recombination centers 1730.

Figure 18:
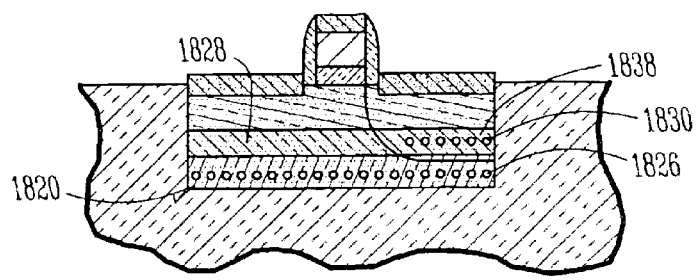
FIG. 18 illustrates a cross section along line 18—18 of FIG. 16 according to various embodiments of the present subject matter.

FIG. 18 illustrates a cross section along line 18—18 of FIG. 16 according to various embodiments of the present subject matter. The n-well 1820, BOX recombination centers 1826, and Si—Ge layer 1828 and associated p+ region 1838 with recombination centers 1830 are shown.

Figure 19:
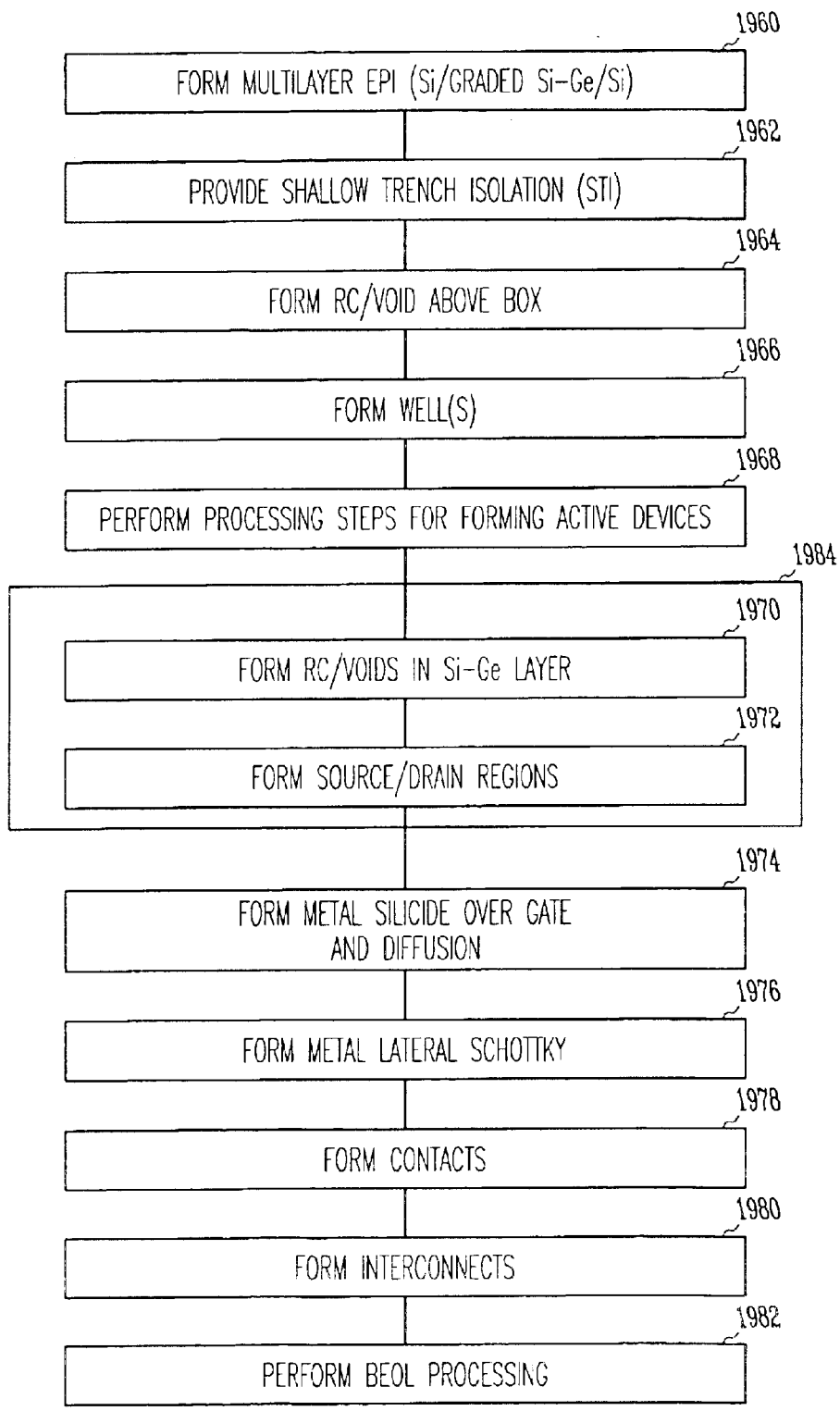
FIG. 19 illustrates a method for fabricating PD-SOI devices according to various embodiments of the present subject matter.

FIG. 19 illustrates a method for fabricating PD-SOI devices according to various embodiments of the present subject matter. At 1960, a multilayer epitaxy is formed over a buried oxide insulating layer (BOX). In various embodiments, the multilayer is formed by depositing a first Si epitaxial layer of a first conductivity type, depositing a graded Si—Ge epitaxial layer of the first conductivity type of the first Si epitaxial layer, and depositing a top Si epitaxial layer of the first conductivity type on the Si—Ge epitaxial layer. Shallow trench isolation (STI) is provided at 1962.

At 1964, recombination centers (BOX recombination centers) are formed in the first epitaxial layer near the BOX interface. In various embodiments, the BOX recombination centers include helium-implanted voids or nanocavities. At 1966, wells are formed. Certain processing steps for forming active devices are performed at 1968. Some of these are illustrated below in FIG. 21.

At 1970, recombination centers are formed in the Si—Ge layer. In various embodiments, the recombination centers include helium-implanted voids. At 1972, source/drain regions are formed.

At 1974, a metal silicide is formed over gate and diffusion regions. According to various embodiments, the metal silicide includes Tungsten Silicide ($WSi_2$), Cobalt-Silicide (CoSi), or Nickel-Silicide (NiSi).

A metal lateral Schottky layer is formed at 1976. In various embodiments, the metal lateral Schottky layer includes tungsten (W), nickel (Ni), titanium (Ti), gold (Au), cobalt (Co) and magnesium (Mg)

Contacts for the source/drain regions and gate regions are formed at 1978. Interconnects are formed at 1980. Back-end-of-line (BEOL) processing is performed at 1982.

One of ordinary skill in the art will understand, upon reading and comprehending this disclosure, how to modify the illustrated method to fabricate any of the structures described herein.

Figure 20:
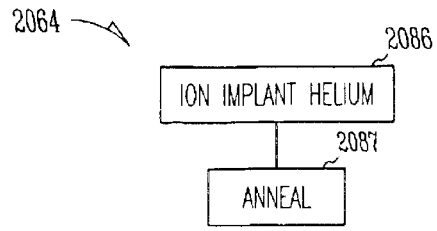
FIG. 20 illustrates various embodiments for forming voids above the buried oxide (BOX).

FIG. 20 illustrates one embodiment for forming voids above the buried oxide (BOX), such as was previously illustrated at 1964 in FIG. 19. In the illustrated embodiment 2064, helium is ion implanted at 2086, and an annealing process is performed at 2087 to form the voids.

Figure 21:
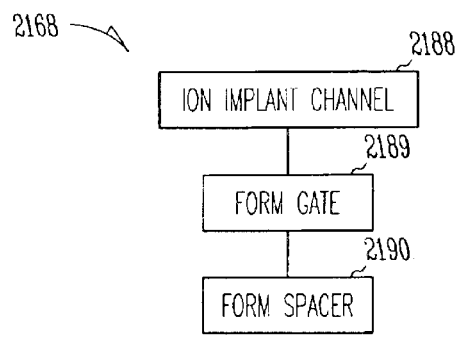
FIG. 21 illustrates various embodiments for forming active devices.

FIG. 21 illustrates one embodiment for forming active devices, such as was previously illustrated at 1968 in FIG. 19. The illustrated method involves processing steps used in a process of forming active devices. In the illustrated embodiment 2068, a channel is ion implanted for transistor threshold adjustment at 2188. At 2189, a gate is formed (along with gate oxide layer) over the channel. At 2190, a spacer is formed around the gate.

Figure 22:
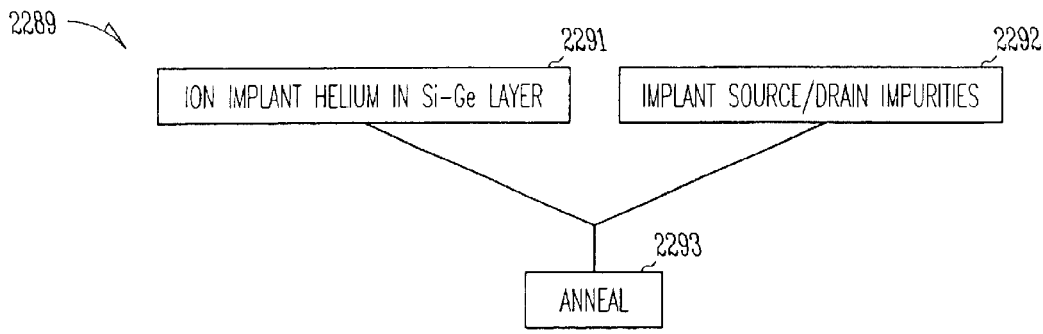
FIG. 22 illustrates various embodiments for forming voids in the Si—Ge layer and for forming source/drain regions.

FIG. 22 illustrates one embodiment for forming voids in the Si—Ge layer and for forming source/drain regions, such as was previously illustrated at 1984 in FIG. 19. In the illustrated embodiment 2284, helium is ion implanted in the Si—Ge epitaxial layer at 2291, and source/drain impurities are implanted at 2292. The result is that helium is implanted in the source/drain region. At 2293, an annealing process is performed to activate the impurities and form voids.

Figure 23:
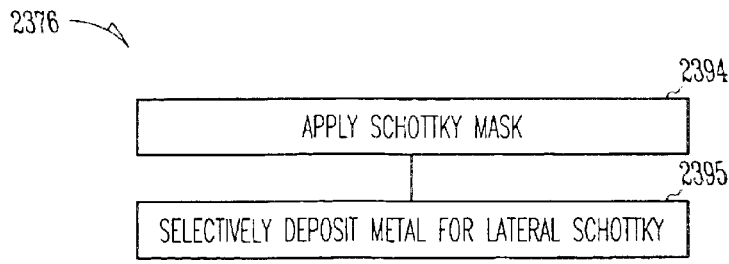
FIG. 23 illustrates various embodiments for forming lateral Schottky regions for the PD-SOI devices.

FIG. 23 illustrates one embodiment for forming lateral Schottky regions for the PD-SOI devices, such as was previously illustrated at 1976 in FIG. 19. In the illustrated embodiment 2376, a special Schottky mask is applied at 2394, and is used to form the metal silicide lateral Schottky when the metal silicide is formed at 1974 in FIG. 19. At 2395, a metal layer is selectively deposited for the metal lateral Schottky.

In various embodiments, the above-described PD-SOI devices and methods are integrated into ultra-shallow raised source/drain or raised source/drain-gate structures using a selective epitaxial growth technique.

System Level

Figure 24:
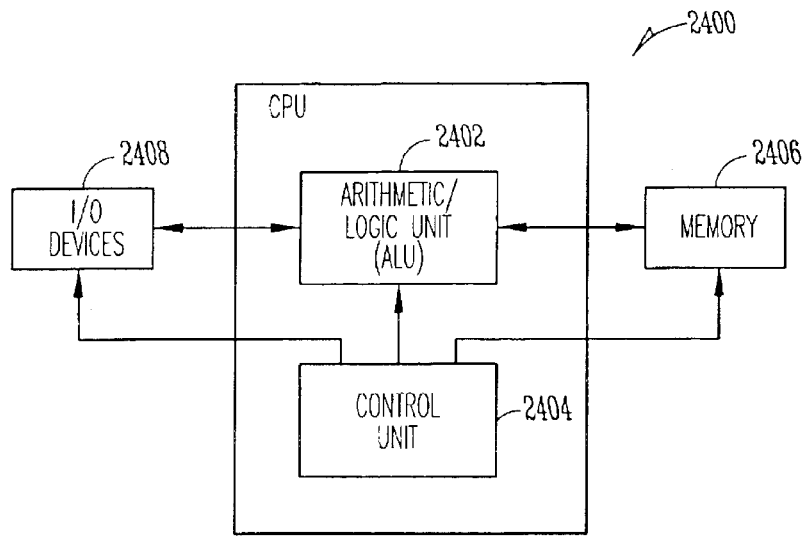
FIG. 24 is a simplified block diagram of a high-level organization of various embodiments of an electronic system according to the present subject matter.

FIG. 24 is a simplified block diagram of a high-level organization of various embodiments of an electronic system according to the present subject matter. In various embodiments, the system 2400 is a computer system, a process control system or other system that employs a process and associated memory. The electronic system 2400 has functional elements, including a processor or arithmetic/logic unit (ALU) 2402, a control unit 2404, a memory device unit 2406 and an input/output (I/O) device 2408. Generally such an electronic system 2400 will have a native set of instructions that specify operations to be performed on data by the processor 2402 and other interactions between the processor 2402, the memory device unit 2406 and the I/O devices 2408. The control unit 2404 coordinates all operations of the processor 2402, the memory device 2406 and the I/O devices 2408 by continuously cycling through a set of operations that cause instructions to be fetched from the memory device 2406 and executed. According to various embodiments, the memory device 2406 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a chip produced with the PD-SOI device in accordance with the present subject matter.

Figure 25:
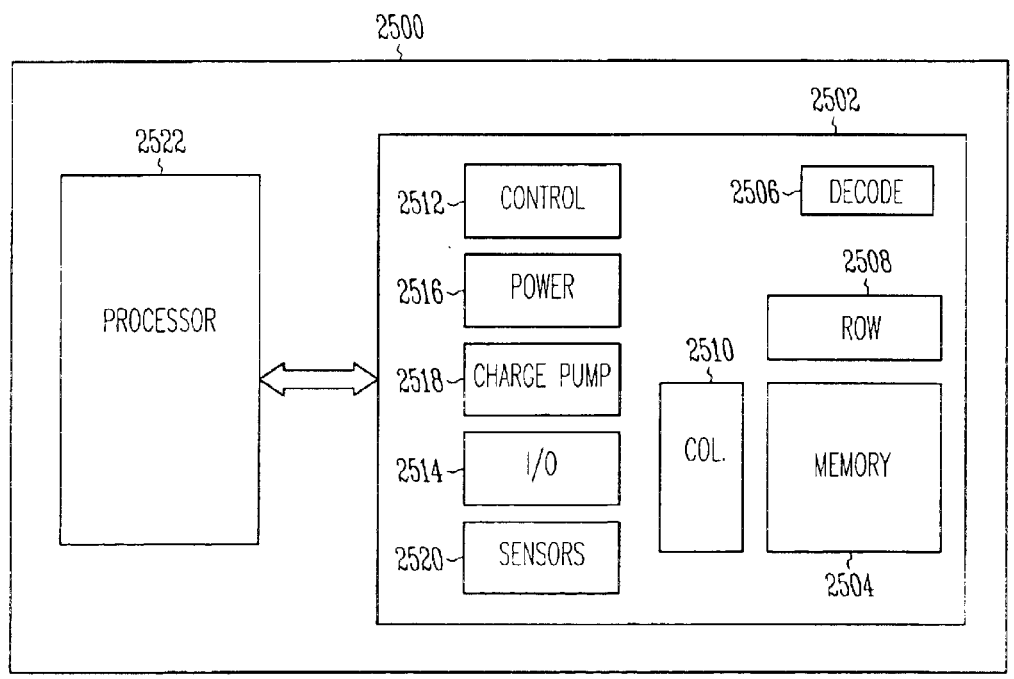
FIG. 25 is a simplified block diagram of a high-level organization of various embodiments of an electronic system according to the present subject matter.

FIG. 25 is a simplified block diagram of a high-level organization of various embodiments of an electronic system according to the present subject matter. The system 2500 includes a memory device 2502 which has an array of memory cells 2504, address decoder 2506, row access circuitry 2508, column access circuitry 2510, control circuitry 2512 for controlling operations, and input/output circuitry 2514. The memory device 2502 further includes power circuitry 2516, a charge pump 2518 for providing the higher-voltage programming pulses, and sensors 2520 such as current sensors for determining whether a memory cell is in a low-threshold conducting state or in a high-threshold nonconducting state. Also, as shown in FIG. 25, the system 2500 includes a processor 2522, or memory controller for memory accessing. The memory device 2502 receives control signals 2524 from the processor 2522 over wiring or metallization lines. The memory device 2502 is used to store data which is accessed via I/O lines. It will be appreciated by those skilled in the art that additional circuitry and control signals can be provided, and that the memory device 2502 has been simplified to help focus on the invention. At least one of the processor 2522 or memory device 2502 has a PD-SOI structure according to the present subject matter.

The illustration of system, as shown in FIG. 25, is intended to provide a general understanding of one application for the structure and circuitry of the present subject matter, and is not intended to serve as a complete description of all the elements and features of an electronic system using a PD-SOI structure according to the present subject matter. As one of ordinary skill in the art will understand, such an electronic system can be fabricated in single-package processing units, or even on a single semiconductor chip, in order to reduce the communication time between the processor and the memory device.

Applications containing the PD-SOI structure as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 26:
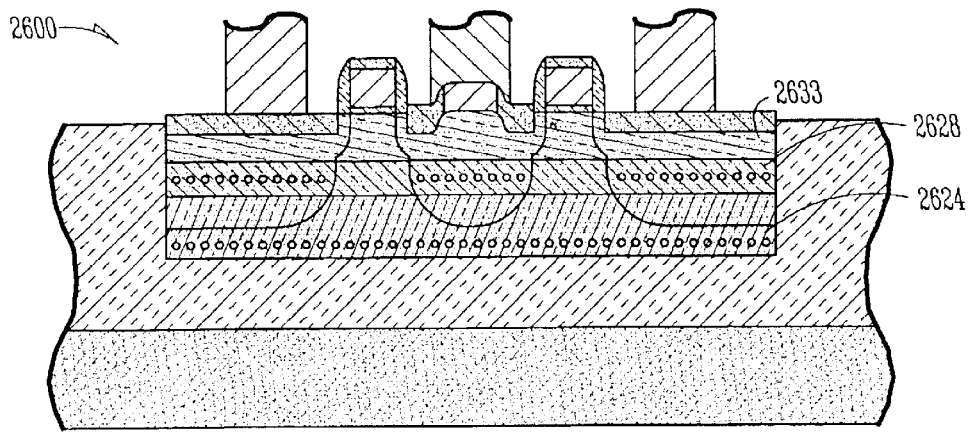
FIG. 26 illustrates a cross section, such as that illustrated in FIG. 7, according to various embodiments of the present subject matter.
Figure 27:
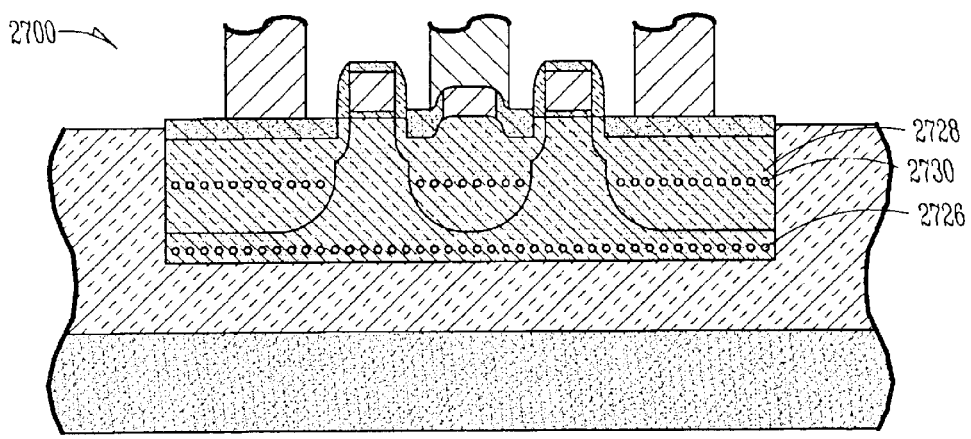
FIG. 27 illustrates a cross section, such as that illustrated in FIG. 7, according to various embodiments of the present subject matter.
Figure 28:
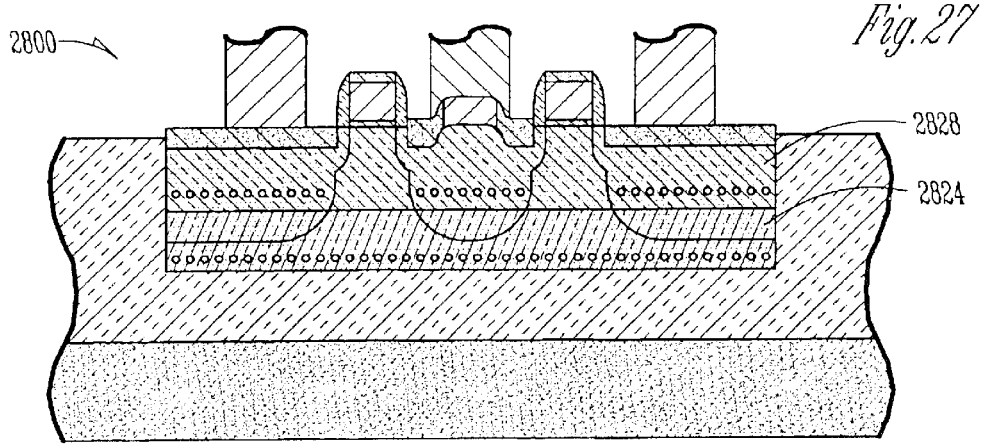
FIG. 28 illustrates a cross section, such as that illustrated in FIG. 7, according to various embodiments of the present subject matter.

Adaptations or variations of the present subject include, but are not limited to, those shown with respect to FIGS. 26, 27 and 28. Such variations include, for example, silicon-germanium-on-insulator (SGOI) technology with or without incorporating a strain-silicon top epitaxial layer for enhanced carrier mobility and circuit performance.

FIG. 26 illustrates a cross section, such as that illustrated in FIG. 7, according to various embodiments of the present subject matter. The illustrated structure 2600 includes a first silicon (Si) epitaxial layer 2624, a silicon germanium (Si—Ge) epitaxial layer 2628 disposed above the first Si epitaxial layer 2624, and a strained silicon (Si) layer 2633 disposed above the Si—Ge layer 2628. The strained lattice in the layer 2633 increases electron and hole mobility. The first Si layer 2624 includes recombination centers 2626 and the Si—Ge layer 2628 includes recombination centers 2630 that function similarly to the recombination centers 726 and 730 described with respect to FIG. 7.

FIG. 27 illustrates a cross section, such as that illustrated in FIG. 7, according to various embodiments of the present subject matter. The illustrated structure 2600 includes a relaxed silicon germanium (Si—Ge) epitaxial layer 2728 with recombination centers 2726 and recombination centers 2730 that function similarly to the recombination centers 726 and 730 described with respect to FIG. 7.

FIG. 28 illustrates a cross section, such as that illustrated in FIG. 7, according to various embodiments of the present subject matter. The illustrated structure 2800 includes a first silicon (Si) epitaxial layer 2824, and a silicon germanium (Si—Ge) epitaxial layer 2828 disposed above the first Si epitaxial layer 2824. The first Si layer 2824 includes recombination centers 2826 and the Si—Ge layer 2828 includes recombination centers 2830 that function similarly to the recombination centers 726 and 730 described with respect to FIG. 7.

CONCLUSION

The present subject matter provides improved PD-SOI devices and methods. Regardless of the time constant and mechanism of hole generation, the recombination time constant of the PD-SOI according to the present subject matter is significantly faster than the intrinsic switching time of the device, and therefore, the threshold of the device is maintained constant at all circuit frequencies. The resulting device does not exhibit any floating body parasitic effects or any enhanced DIBL (drain induced barrier lowering) effect as seen in standard SOI devices.

Various embodiments use a lateral metal Schottky layer to provide an integrated source-body Schottky diode whose forward characteristics uniquely targets the steady state potential for the body of the SOI device. Various embodiments use a Si—Ge epitaxial layer to create a lower body-source barrier potential and provide a preferential path for sweeping drain-edge high-field generated carriers (impact ionization) as well as thermally-generated excess carriers for recombination at the source-body region of the channel. Various embodiment provide recombination centers in the Si—Ge epitaxial layer to enhance the recombination of holes at the source-body region of the channel. Various embodiments use BOX recombination centers to readily recombine excess holes generated by impact ionization at the drain-body region as well as by thermally-generated carriers. This recombination of excess holes has a very short time constant.

This disclosure refers to several figures that resemble flow diagrams. One of ordinary skill in the art will understand, upon reading and comprehending this disclosure, that the methods related to the flow diagrams may occur in the order as illustrated in the flow diagrams, and may be ordered in another manner. Thus, the present subject matter is not limited to a particular order or logical arrangement.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A partially depleted silicon-on-insulator structure, comprising:
   a substrate;
   an oxide insulation layer disposed above the substrate;
   an active region formed above the oxide insulation layer, the active region including a multilayer epitaxy including a silicon epitaxial layer and a silicon germanium (Si—Ge) epitaxial layer, the Si—Ge epitaxial layer including a number of recombination centers;
   at least one source region and at least one drain region formed in the active region, the recombination centers in the Si—Ge epitaxial layer including recombination centers in the source region and the drain region;
   a gate oxide layer formed above the active region to define a channel region in the active region between the source region and the drain region; and
   a gate formed above the gate oxide layer.

2. The structure of claim 1, wherein the recombination centers include voids formed in the Si—Ge epitaxial layer.

3. The structure of claim 1, wherein the recombination centers include helium-implanted nanocavities formed in the Si—Ge epitaxial layer.

4. The structure of claim 1, wherein the active region includes a number of recombination centers between the Si—Ge epitaxial layer and the oxide insulation layer.

5. The structure of claim 1, further comprising a lateral metal Schottky layer selectively formed above the active region to contact the source region and the active region.

6. The structure of claim 1, wherein the active region includes p-type silicon and both the source region and the drain region include n-type silicon to form an NFET-SOI device.

7. The structure of claim 1, wherein the active region includes n-type silicon and both the source region and the drain region include p-type silicon to form an PFET-SOI device.

8. A partially depleted silicon-on-insulator structure, comprising:
   a substrate;
   an oxide insulation layer disposed above the substrate;
   an active region formed above the oxide insulation layer, including:
   a first silicon (Si) epitaxial layer disposed above the oxide insulation layer, the first Si epitaxial layer including a number of recombination centers;

a silicon germanium (Si—Ge) epitaxial layer disposed above the first Si epitaxial layer, the Si—Ge epitaxial layer including a number of recombination centers; and a second Si epitaxial layer disposed above the Si—Ge epitaxial layer;

at least one source region and at least one drain region formed in the active region, the recombination centers in the Si—Ge epitaxial layer including recombination centers in the source region and the drain region;

a gate oxide layer formed above the active region to define a channel region in the active region between the source region and the drain region;

a gate formed above the gate oxide layer;

a metal silicide layer formed above the second Si epitaxial layer; and a lateral metal Schottky layer selectively formed above the second Si epitaxial layer to contact the source region and the active region.

9. The structure of claim 8, wherein the recombination centers include voids formed in the structure.

10. The structure of claim 8, wherein the recombination centers include helium-implanted nanocavities formed in the structure.

11. The structure of claim 8, wherein the lateral metal Schottky layer includes tungsten (W).

12. The structure of claim 8, wherein the lateral metal Schottky layer includes Nickel (Ni).

13. The structure of claim 8, wherein the lateral metal Schottky layer includes titanium (Ti).

14. The structure of claim 8, wherein the lateral metal Schottky layer includes gold (Au).

15. The structure of claim 8, wherein the lateral metal Schottky layer includes cobalt (Co).

16. The structure of claim 8, wherein the lateral metal Schottky layer includes magnesium (Mg).

17. The structure of claim 8, wherein the metal silicide layer includes tungsten (W) silicide.

18. The structure of claim 8, wherein the metal silicide layer includes cobalt (Co) silicide.

19. The structure of claim 8, wherein the metal silicide layer includes Nickel (Ni) silicide.

20. The structure of claim 8, wherein the metal silicide layer and the lateral metal Schottky layer provide a parallel connection between the source region and the active region.

21. The structure of claim 8, wherein the structure forms an NFET-SOI device, and both the first Si epitaxial layer and the second Si epitaxial layer include p-type silicon.

22. A partially depleted silicon-on-insulator structure, comprising:

a substrate;

an oxide insulation layer disposed above the substrate;

an active region formed above the oxide insulation layer, including a number of recombination centers positioned near the oxide insulator layer;

at least one source region and at least one drain region formed in the active region;

a gate oxide layer formed above the active region to define a channel region in the active region between the source region and the drain region;

a gate formed above the gate oxide layer; and a lateral metal Schottky layer selectively formed to contact the source region and the active region, wherein the active region includes a multilayer epitaxy including a silicon epitaxial layer and an Si—Ge epitaxial layer, the Si—Ge epitaxial layer includes recombination centers, and the recombination centers include recombination centers in the source region and the drain region.

23. The structure of claim 22, wherein the recombination centers include voids formed in the active region.

24. The structure of claim 22, wherein the recombination centers include helium-implanted nanocavities formed in the active region.

25. The structure of claim 22, further comprising a metal silicide layer formed above the active region to contact the source region and the active region in parallel with the lateral metal Schottky layer.

26. The structure of claim 22, wherein the active region includes p-type silicon and both the source region and the drain region include n-type silicon to form an NFET-SOI device.

27. The structure of claim 22, wherein the lateral metal Schottky layer includes tungsten (W).

28. The structure of claim 22, wherein the lateral metal Schottky layer includes Nickel (Ni).

29. The structure of claim 22, wherein the lateral metal Schottky layer includes titanium (Ti).

30. The structure of claim 22, wherein the lateral metal Schottky layer includes gold (Au).

31. The structure of claim 22, wherein the lateral metal Schottky layer includes cobalt (Co).

32. The structure of claim 22, wherein the lateral metal Schottky layer includes magnesium (Mg).

33. A partially depleted silicon-on-insulator structure, comprising:

a substrate;

an oxide insulation layer disposed above the substrate;

an active region formed above the oxide insulation layer, the active region including a multilayer epitaxy including a silicon epitaxial layer and a silicon germanium (Si—Ge) epitaxial layer, the Si—Ge epitaxial layer including a number of recombination centers;

at least one source region and at least one drain region formed in the active region, the recombination centers in the Si—Ge epitaxial layer including recombination centers in the source region and the drain region;

a gate oxide layer formed above the active region to define a channel region in the active region between the source region and the drain region;

a gate formed above the gate oxide layer; and a lateral metal Schottky layer selectively formed to contact the source region and the active region.

34. The structure of claim 33, wherein the recombination centers include voids formed in the Si—Ge epitaxial layer.

35. The structure of claim 33, wherein the recombination centers include helium-implanted nanocavities formed in the Si—Ge epitaxial layer.

36. The structure of claim 33, wherein the active region includes a number of recombination centers between the Si—Ge epitaxial layer and the oxide insulation layer.

37. The structure of claim 33, further comprising a metal silicide layer formed above the active region to contact the source region and the active region in parallel with the lateral metal Schottky layer.

38. The structure of claim 33, wherein the active region includes p-type silicon and both the source region and the drain region include n-type silicon to form an NFET-SOI device.

39. The structure of claim 33, wherein the lateral metal Schottky layer includes tungsten (W).

40. The structure of claim 33, wherein the lateral metal Schottky layer includes Nickel (Ni).

41. The structure of claim 33, wherein the lateral metal Schottky layer includes titanium (Ti).

42. The structure of claim 33, wherein the lateral metal Schottky layer includes gold (Au).

43. The structure of claim 33, wherein the lateral metal Schottky layer includes cobalt (Co).

44. The structure of claim 33, wherein the lateral metal Schottky layer includes magnesium (Mg).

45. A partially depleted silicon-on-insulator structure, comprising:

a substrate;

an oxide insulation layer disposed above the substrate;

an active region formed on the oxide insulation layer, the active region including a first silicon epitaxial layer, a second silicon epitaxial layer, and a silicon germanium (Si—Ge) epitaxial layer between the first and second silicon epitaxial layers, the active region including a number of recombination centers between the Si—Ge epitaxial layer and the oxide insulation layer, the Si—Ge epitaxial layer including a number of recombination centers;

at least one source region and at least one drain region formed in the active region, the recombination centers in the Si—Ge epitaxial layer including recombination centers in the source region and the drain region;

a gate oxide layer formed above the active region to define a channel region in the active region between the source region and the drain region; and a gate formed above the gate oxide layer.

46. The structure of claim 45, wherein the recombination centers include voids formed in the structure.

47. The structure of claim 45, wherein the recombination centers include helium-implanted nanocavities formed in the structure.

48. The structure of claim 45, wherein the active region includes p-type silicon and both the source region and the drain region include n-type silicon to form an NFET-SOI device.

49. The structure of claim 45, wherein the active region includes n-type silicon and both the source region and the drain region include p-type silicon to form an PFET-SOI device.

50. The structure of claim 45, further comprising a metal silicide layer formed above the active region to contact the source region and the active region.

51. The structure of claim 45, further comprising a lateral metal Schottky layer selectively formed to contact the source region and the active region.

52. The structure of claim 45, further comprising a metal silicide layer and a lateral metal Schottky layer selectively formed to contact the source region and the active region, wherein the metal silicide layer and the lateral metal Schottky layer provide a parallel contact between the source region and the active region.

* * * * *

UNITED STATES PATENT AND TRADEMARK OFFICE
CERTIFICATE OF CORRECTION

PATENT NO. : 6,828,632 B2
DATED : December 7, 2004
INVENTOR(S) : Bhattacharyya

It is certified that error appears in the above-identified patent and that said Letters Patent is hereby corrected as shown below:

<u>Title page,</u>
Item [56], References Cited, OTHER PUBLICATIONS, "Van Meer" reference, delete "2000" and insert -- 2001 --, therefor.

<u>Column 8,</u>
Lines 29 - 30, delete "NEET-SOT" and insert -- NFET-SOI --, therefor.
Line 39, after "0.67 V" delete "." and insert -- , --, therefor.

<u>Column 9,</u>
Line 37, delete "SiGe" and insert -- Si—Ge --, therefor.

<u>Column 10,</u>
Line 3, delete "suicide" and insert -- silicide --, therefor.

<u>Column 11,</u>
Line 25, after "(Mg)" insert -- . --.

Signed and Sealed this

Third Day of May, 2005

JON W. DUDAS
*Director of the United States Patent and Trademark Office*